United States Patent [19]

Bauck et al.

[11] Patent Number: 4,783,754
[45] Date of Patent: Nov. 8, 1988

[54] PREPROCESSOR FOR SPECTRAL PATTERN CLASSIFICATION SYSTEMS

[75] Inventors: Jerald L. Bauck, Mesa, Ariz.; Robert Hecht-Nielsen, Del Mar, Calif.

[73] Assignee: Motorola, Inc., Schaumburg, Ill.

[21] Appl. No.: 627,242

[22] Filed: Jul. 2, 1984

[51] Int. Cl.$^4$ .......................... G01L 1/06; G06F 15/34
[52] U.S. Cl. ..................... 364/513.5; 381/43
[58] Field of Search ............... 364/485, 572, 576, 724, 364/726, 825, 826, 827, 513.5; 382/27, 29, 42, 43; 381/43

[56] References Cited

U.S. PATENT DOCUMENTS

| | | | |
|---|---|---|---|
| T910,009 | 5/1973 | Abramson | 364/726 |
| 3,111,645 | 11/1963 | Milford | 382/29 |
| 3,388,240 | 6/1968 | Robbins | 382/29 |
| 3,544,894 | 12/1970 | Hartwell et al. | 364/485 |
| 3,566,080 | 2/1971 | Uffelman et al. | 382/29 |
| 3,889,234 | 6/1975 | Makihara et al. | 382/27 |
| 3,971,927 | 7/1976 | Speiser et al. | 364/827 |
| 4,010,360 | 3/1977 | Alsup et al. | 364/827 |
| 4,049,958 | 9/1977 | Hartmann | 364/826 |
| 4,071,906 | 1/1978 | Buss | 364/827 |
| 4,084,255 | 4/1978 | Casasent et al. | 382/43 |
| 4,093,989 | 6/1978 | Flink et al. | 364/485 |
| 4,121,192 | 10/1978 | Wilson | 382/28 |
| 4,152,772 | 5/1979 | Speiser et al. | 364/826 |
| 4,231,103 | 10/1980 | Timm | 364/726 |
| 4,286,326 | 8/1981 | Houdard | 364/485 |
| 4,322,716 | 3/1982 | Sternberg | 382/27 |

FOREIGN PATENT DOCUMENTS

56-80787 7/1981 Japan .

Primary Examiner—Salvatore Cangialosi
Attorney, Agent, or Firm—Maurice J. Jones; Eugene A. Parsons

[57] ABSTRACT

The signal to be classified is sampled and the samples are multiplied by weighting functions prior to performing discrete Fourier transforms, power calculations, and normalization thereon so that the preprocessor is essentially a plurality of channel bandpass filter stages, the k-th one of which has a frequency response approximating an ideal filter defined by $$H_k^\alpha(e^{j\omega}) = \begin{cases} \cos^{\frac{1}{2}}\left(\frac{\omega N - 2\pi k}{4\alpha}\right), & (k-\alpha)\frac{2\pi}{N} \leq \omega \leq (k+\alpha)\frac{2\pi}{N} \\ 0 & \text{otherwise} \end{cases}$$

where
k = 0, $\alpha$, 2$\alpha$, 3$\alpha$, ..., r$\alpha$
$\alpha$ = constant, $1 \leq \alpha \leq N/2$
r + 1 = greatest integer in N/$\alpha$ This preprocessor transforms blocks of one dimensional data into spectra in such a way that data blocks coming from similar sources will have spectra that are close to one another in spectrum space. The discrete Fourier transform is modified to remove or reduce the phase dependency problem and to enhance the clustering of similar spectra by the weighting function above.

9 Claims, 2 Drawing Sheets

PREPROCESSOR FOR SPECTRAL PATTERN CLASSIFICATION SYSTEMS

BACKGROUND OF THE INVENTION

The present invention pertains to a preprocessor for spectral pattern classification systems and the like. In general, spectral pattern classification systems are systems which classify spectral patterns, such as the frequency spectra of sounds or electromagnetic energy from various sources. Different categories of spectra may be defined in advance so that as a spectrum is received from each source it can be compared to the defined categories and properly classified.

A prior art method of obtaining the spectra from a desired source is to provide a plurality of samples of the source and take the discrete Fourier transform of the samples. Many fast versions of the discrete Fourier transform exist (e.g., the Cooley-Tukey, Winograd, Prime Factor, etc. algorithms), all of which produce the same result and are generally included in the term discrete Fourier transform. Two major problems exist with respect to the power spectrum obtained by means of the discrete Fourier transform. The first problem is that the values making up the spectra depend to an undersirable degree on the phase of the samples of the signal to be classified. The second problem is that the power spectrum derived from two sources that appear to be very similar (i.e., look similar on a spectrum analyzer) do not necessarily lie near one another in spectrum space. As an example, if the spectral patterns being classified are due to sounds coming from two difference sources, the power spectra may not be close to one another even though the sounds come from sources that sound almost alike. This situation might exist, for example, as the result of a modest amount of Doppler shift of one signal relative to the other.

SUMMARY OF THE INVENTION

The present invention pertains to a preprocessor for spectral pattern classification systems and the like which modifies the discrete Fourier transform to remove or reduce the phase dependency problem and to enhance the clustering of similar spectra. In at least one embodiment this is performed by weighting the time-domain samples before being processed by the individual filters that serve to define the frequency spectrum so that the frequency response of the selected stages is substantially defined by $$H_k^\alpha(e^{j\omega}) = \begin{cases} \cos^{\frac{1}{2}}\left(\frac{\omega N - 2\pi k}{4\alpha}\right), & (k-\alpha)\frac{2\pi}{N} \leq \omega \leq (k+\alpha)\frac{2\pi}{N} \\ 0 & \text{otherwise} \end{cases} \quad (0)$$

where:
$k = 0, \alpha, 2\alpha, 3\alpha, \ldots, r\alpha$
$\alpha = \text{constant}, 1 < \alpha < N/2$
$r+1 = \text{greatest integer in } N/\alpha$
In this relationship, the frequency variable has been scaled so that $2\pi$ radians/second corresponds to the signal sampling rate.

It is an object of the present invention to provide a new and improved preprocessor for spectral pattern classification systems and the like.

It is a further object of the present invention to provide a preprocessor for spectral pattern classification systems and the like wherein dependency on the phase of samples of the signal to be classified is removed or substantially reduced.

It is a further object of the present invention to provide a preprocessor for spectral pattern classsification systems wherein similar spectrum clustering is provided.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

The present invention is embodied in apparatus and a method for transforming blocks of one-dimensional (i.e., time) data into spectra in such a way that data block coming from similar sources will have spectra that are close to one another in spectrum space. Given N samples of data:

$$\{x_0, x_1, x_2, \ldots, x_{N-1}\} = \{x_i\}_{i=1}^{N-1}$$

from a source, it is desired to convert these samples to a spectrum. The samples may be obtained from, for example, sensors which sense the sound of a device, sonar, radar doppler infrared sensors, heat sensors, etc. A standard method of converting the samples to a spectrum is to take the discrete Fourier transform of the samples. Two major problems exist with respect to the discrete Fourier transform power spectrum: (1) the resultant numbers depend to an undesirable degree on the phase of the samples and (2) the power spectrum vectors from two sample sets which are derived from two sources that appear similar in frequency space (such as on the scope of a spectrum analyzer) do not necessarily lie near one another in spectrum space.

The simplest answer to the problem of phase dependency is the introduction of a filter window. Such a filter window may be produced by providing a set of N numbers $$\{w_i\}_{i=0}^{N-1}$$

that are used to carry out the operation $$\{x_i\} \to \{w_i x_i\}, i = 0, 1, \ldots, N-1$$

before performing the discrete Fourier transform. This operation produces reduced phase sensitivity for a variety of choices of the numbers $w_i$.

Figure 1:
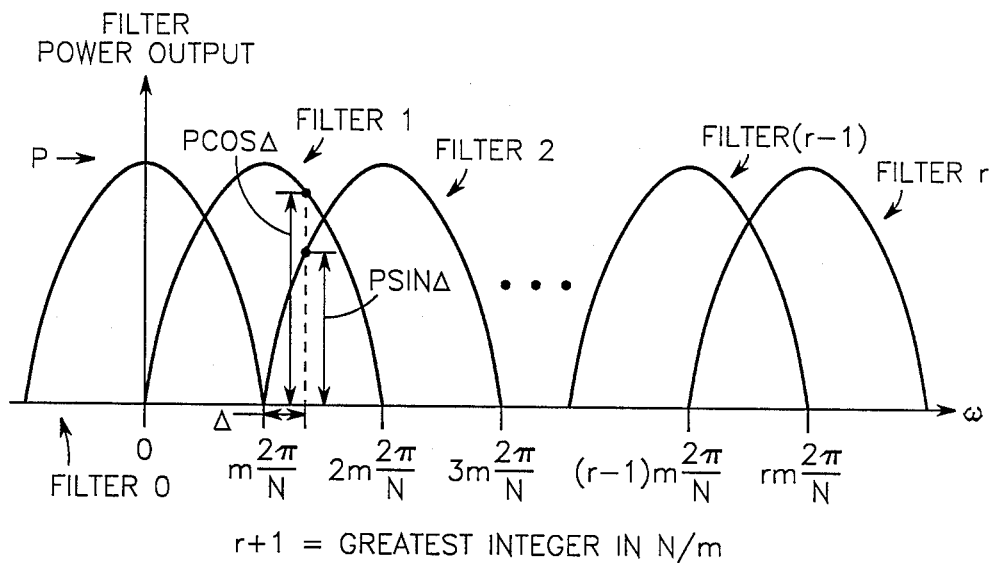
FIG. 1 illustrates the relationship of overlapping frequency response curves of the properly selected frequency channels.

The problem of similar spectrum clustering is more difficult. To make the problem precise, state the requirement that two single spectral line signals (represented by sample sets $\{x_i\}$ and $\{x_i''\}$) that have their lines which are simple sine wave frequencies separated by a distance $\Delta$ in frequency should have normalized spectral points $P_1$ and $P_2$ within an angle $[\pi(N-1)/\alpha\omega_s]\Delta$ of one another, where $\omega_s$ is the sampling frequency at which the sample sets were obtained. This formula will hold true if and only if the frequency response of individual filters that serve to define the discrete power spectrum overlap exactly one-half the bandpass of adjacent filters. In order to form a good approximation to this desired behavior only a subset ($K=0, \alpha, 2\alpha, \ldots, r\alpha$) of the N frequency channels of the Fourier transform are used in forming the power spectrum. Further, the channel bandpass filters must be shaped, in voltage, like the functions $H_k{}^\alpha(e^{j\omega})$, $K=0, \alpha, 2\alpha, 3\alpha, \ldots, r\alpha$; so that as a single spectral line moves slightly between adjacent chosen spectral frequency bins the point representing the spectrum rotates slightly around the origin. Referring specifically to FIG. 1, where the sinusoidal power level P corresponds to the voltage level $\sqrt{P}$, if the spectrum is represented by vector P in spectrum space, $\underline{P}=[0,0 \ldots, (P \cos \Delta), (P \sin \Delta), 0,0 \ldots, 0]$, then the frequency response curves of FIG. 1 are formed in accordance with equation (0) above and overlap as described. Values of $\alpha$ greater than 1 permit better approximation of the desired frequency response using a weighting window $w_n$. However, for $\alpha > 1$ it requires $\alpha$ times as much sample data to achieve a given frequency resolution in the power spectrum as in the $m=1$ case. Thus, the choice of $\alpha$ is highly application dependent. Typical values are $\alpha=1, 2, 3,$ or 4. From FIG. 1 it can be seen that point P rotates in linear proportion to $\Delta$. Thus, spectra that are similar to one another get mapped into points that are close to one another.

The following formalizes the overall process and presents a minimum-mean-squared error solution to an approximation which exploits the efficiency of the discrete Fourier transform. To simplify the presentation, the case $\alpha = 1$ will be treated below. The modifications required for the $\alpha > 1$ case are simple and will be obvious to anyone skilled in the art.

The power versus frequency responses of the filters of the filter bank of FIG. 1 are given by $$|H_k(e^{j\omega})|^2 = \begin{cases} \cos\left(\dfrac{\omega N - 2\pi K}{4}\right), (k-1)\dfrac{2\pi}{N} \leq \omega \leq (k+1)\dfrac{2\pi}{N} \\ 0 \text{ otherwise} \end{cases} \quad (1)$$

where $k=0, 1, \ldots, N-1$, and where the notation $e^{j\omega}$ is used in anticipation of a discrete-time implementation. To make the filter bank a useful pattern preprocessor, the outputs of each filter are detected at some instant of time. The numbers so collected are best conceptualized as a vector $p=[p_0, p_1 \ldots, p_{n-1}]^t$ where $p_n$ is the detected output of the n-th filter. It is also necessary to provide insensitivity to overall signal level, since signal level does not contribute any useful information to the classifier which follows. This is accomplished by simply normalizing p, i.e., $$s = \frac{p}{\|p\|}. \quad (2)$$

where $$\|p\| = \left(\sum_{n=0}^{N-1} p_n{}^2\right)^{\frac{1}{2}} \quad (3)$$

is the Euclidean norm of any $p \in IR^r$. This normalization then forces all vectors to lie on the unit hypersphere. Note that since all of the components of such vectors represent power (which is always non-negative), all of these vectors will point into the positive $2^r$-tant of $IR^r$.

Since the filters in the filter bank described above and shown in FIG. 1 each have finite support in the frequency domain, i.e., they have strictly bandlimited transfer functions, they cannot be realized in practice. A useful approximation is afforded by the minimum mean-squared error (MSE) method. If $H_k(e^{j\omega})$ is the complex-valued desired transfer function, then the optimum filter is that function $\hat{H}_k(e^{j\omega})$ which minimizes the mean-squared error.

$$\epsilon = \frac{1}{2\pi} \int_{-\pi}^{\pi} |H_k(e^{j\omega}) - \hat{H}_k(e^{j\omega})|^2 \, d\omega \quad (4)$$

An optimal form of the described filter bank will be derived, and it will be shown that the discrete Fourier transform can be used to implement that filter bank.

We will use the fact that a periodic function is representable by a Fourier series. The usual formulas for the Fourier coefficients and the series are $$a_n = \frac{1}{2\pi} \int_{-\pi}^{\pi} f(e^{jx}) e^{-jxn} \, dx, \quad -\infty \leq n \leq \infty \quad (6)$$

and $$f(e^{jx}) = \sum_{n=-\infty}^{\infty} a_n e^{jxn}$$

respectively. Using these definitions, the Fourier coefficients for the k-th filter in the filter bank are $$h_k(n) = \frac{1}{2\pi} \int_{(k-1)\frac{2\pi}{N}}^{(k+1)\frac{2\pi}{N}} \cos^{\frac{1}{2}}\left(\frac{\omega N}{4} - \frac{2\pi k}{N}\right) e^{-j\omega n} \, d\omega, \quad -\infty \leq n \leq \infty \quad (7)$$

which are recognized collectively as being the impulse response of that filter. Evaluation of this integral is simplified by using the fact from Fourier theory that if $a_n$ are the coefficients for $f(x)$, then $a_n e^{-jnx_0}$ are the coefficients for $f(x-x_0)$. Also, by breaking the integral into its real and imaginary parts and observing that the imaginary part has an odd-symmetric integrand and that the real part has an even-symmetric integrand, the integral may be expressed as $$h_k(n) = e^{-j\frac{2\pi}{N}nk} h_o(n), \quad -\infty \leq n \leq \infty \tag{9}$$

where $$h_o(n) = \frac{1}{\pi} \int_0^{\frac{2\pi}{N}} \cos^{\frac{1}{2}}\left(\frac{\omega N}{4}\right) \cos(\omega n)\, d\omega, \quad -\infty \leq n \leq \infty \tag{10}$$

The corresponding frequency response for the k-th filter can then be written $$H_k(e^{j\omega}) = \sum_{n=-\infty}^{\infty} h_o(n) e^{-j\frac{2\pi}{N}nk} e^{-j\omega n}, \quad k = 0, 1, \ldots, N-1 \tag{11}$$

The impulse response above is not only infinite in extent, but is non-causal and therefore non-realizable. The theory of the convergence of Fourier series provides a minimum mean-squared error solution to the problem of the impulse response being infinite in extent. As is commonly known, the error specified above is minimized, for any specific value of N, by simply truncating the series, that is, $$\hat{h}_o(n) = \begin{cases} h_o(n), & -(N-1)/2 \leq n \leq (N-1)/2 \\ 0 & \text{otherwise} \end{cases} \tag{12}$$

so that $$\hat{H}_k(e^{j\omega}) = \tag{13}$$

$$\sum_{n=-(N-1)/2}^{(N-1)/2} h_o(n) e^{-j\frac{2\pi}{N}nk} e^{-j\omega n}, \quad k = 0, 1, \ldots, N-1$$

where it is assumed that N is an odd number. (A simple modification to the present derivation applies to the case where N is even.) The problem of non-causality is fixed by simply changing the time index n in the above equation so that it begins as 0, as is done in the next paragraph.

The contention that the discrete Fourier transform can be used to implement the above equation will now be proved. If the data sequence x(n), representing samples of the signal to be classified, is first weighted by a window function w(n), its discrete Fourier transform is given by $$X(k) = \sum_{m=0}^{N-1} x(m)w(m) e^{-j\frac{2\pi}{N}mk}, \quad k = 0, 1, \ldots, N-1 \tag{14}$$

To compute the frequency response (in voltage) of the k-th "bin" of the discrete Fourier transform, i.e, its response to an N-point sequence which consists of samples of a sinusoid of arbitrary frequency, simply substitute $x(m) = \exp(j\ m)$. Assuming again that N is odd (similar comments hold if N is even), and changing indices according to $n = m - (N-1)/2$ to achieve causality as promised in the preceeding paragraph, gives the desired result, $$X_k(e^{j\omega}) = e^{-j\omega\frac{(N-1)}{2}} e^{-j\frac{2\pi}{N}\frac{(N-1)}{2}k} \sum_{n=-(N-1)/2}^{(N-1)/2} e^{-j\omega n} w\left(n + \frac{N-1}{2}\right) e^{-j\frac{2\pi}{N}nk} \tag{15}$$

Making the equivalence $$w(n) = \hat{h}_o\left(n - \frac{N-1}{2}\right), \quad n = 0, 1, \ldots, N-1 \tag{16}$$

or in other terms:

$$w(n) = \frac{1}{\pi} \int_0^{\frac{2\pi}{N}} \cos^{\frac{1}{2}}\left(\frac{\omega N}{4}\right) \cos\left[\omega\left(n - \frac{N-1}{2}\right)\right] d\omega \tag{17}$$

where n=0, 1, 2, ..., N−1, comparison with the approximating frequency response $H_k(e^{j\omega})$ given above shows that $$X_k(e^{j\omega}) = (\text{delay})(\text{constant})\hat{H}_k(e^{j\omega}) \tag{18}$$

The constant delay term and the constant multiplier term can easily be absorbed for exact equality, or merely ignored, as they essentially contribute a simple scale factor. In either case, $$|X_k(e^{j\omega})|^2 = |\hat{H}_k(e^{j\omega})|^2 \tag{19}$$

as desired.

Figure 2:
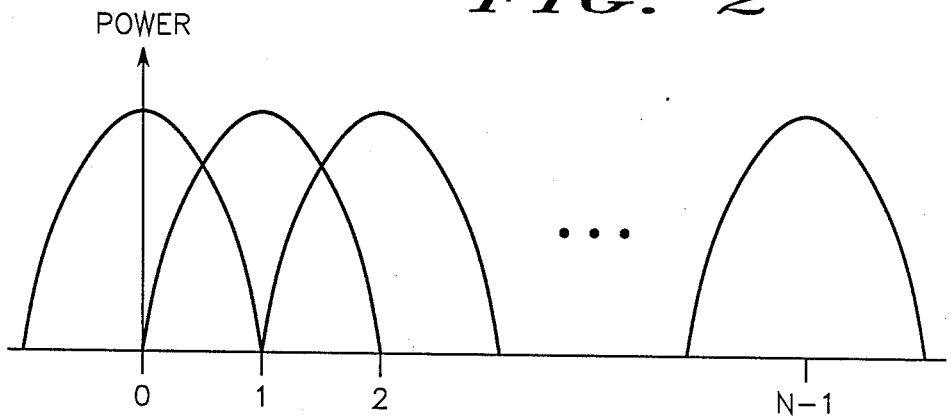
FIG. 2 is the frequency response of a plurality of channel bandpass filter stages according to the present invention.

Using equation 16, the actual frequency response of the synthesized filters become:

$$\hat{H}_k(e^{j\omega}) = \tag{20}$$

$$e^{j\frac{2\pi}{N}\left(\frac{N-1}{2}\right)k} e^{-j\omega\left(\frac{N-1}{2}\right)} \sum_{n=0}^{N-1} w(n) e^{-j\frac{2\pi}{N}nk} e^{j\omega n},$$

$$k = 0, 1, \ldots, N-1$$

where N=number of filter stages, Referring specifically to FIG. 2, the frequency response of N channel bandpass filter stages constructed in accordance with the above approximation is illustrated. The frequency response of each channel bandpass filter stage is defined by equation (13) or equation (20) and the frequency response of adjacent filter stages overlap such that the outermost frequency passed is approximately equal to the center frequency of adjacent stages.

Figure 3:
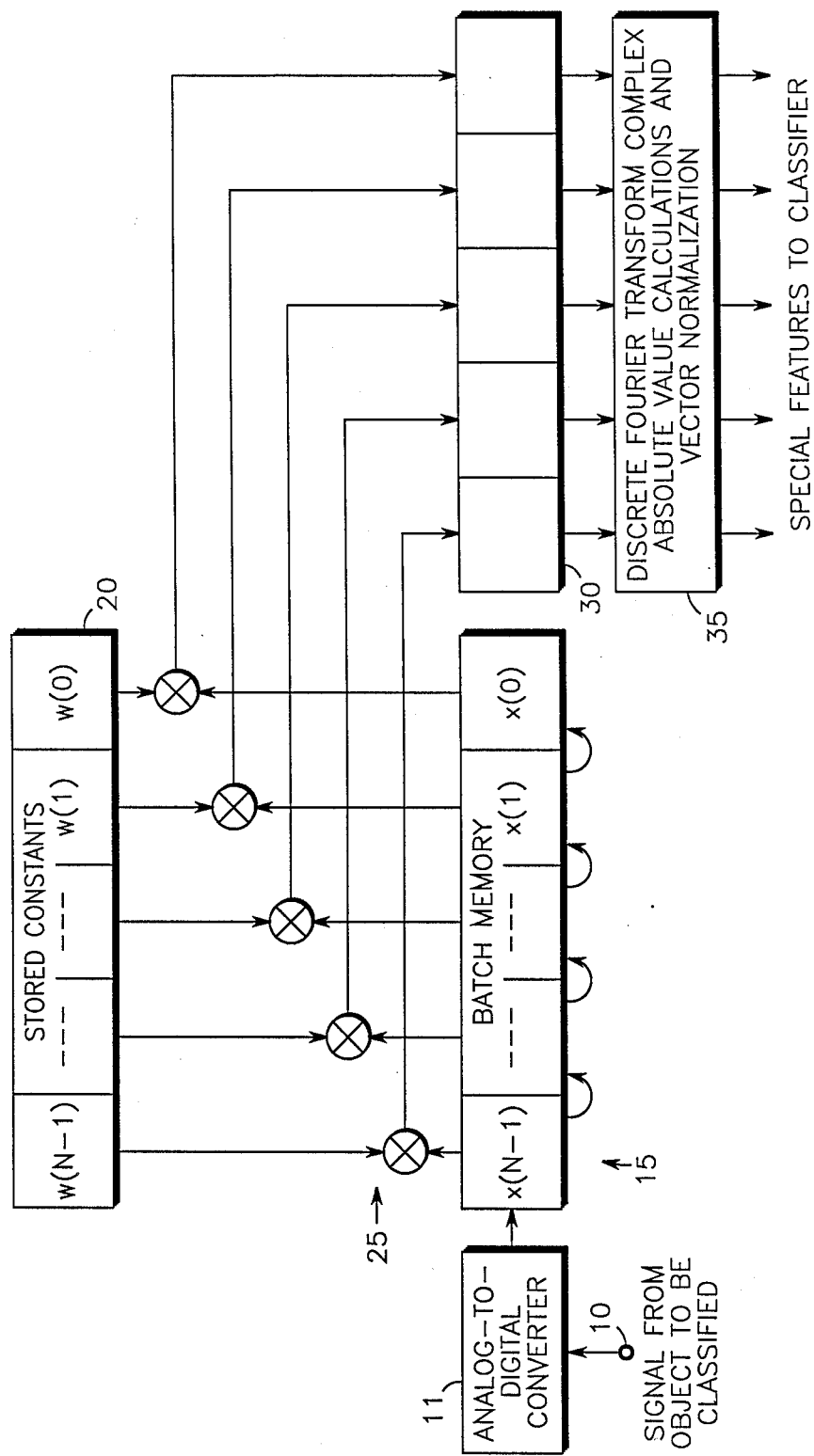
FIG. 3 is a simplified block diagram of a preprocessor for spectral pattern classification systems and the like embodying the present invention.

Referring specifically to FIG. 3, a preprocessor for spectral pattern classification systems embodying the present invention is illustrated. An input terminal 10 is connected to an analog to digital converter 11, the output of which is connected to an input of a word-wide shift register, generally designated 15. While the present embodiment is illustrated in digital form, hence the A-to-D converter 11, it will be understood by those skilled in the art that a complete analog version can be devised if desired and the present digital version is illustrated because of its simplicity and ease of understanding. The shift register 15 contains N stages so that a batch of N samples can be shifted into the register 15 before operating thereon. A memory 20 has N constants, w(0) to w(N−1), stored therein. A bank of N multipliers generally designated 25 are connected to the stages of the shift register 15 and the various constants stored in memory 20 so that the sample in each stage of the shift register is multiplied by one of the constants in one of the multipliers 25. The product of each constant or weight stored in memory 20 and the corresponding sample in shift register 15 is supplied to a storage unit 30 having N stages. Instead of separate storage unit 30 the product could be placed in the shift register 15 so as to replace the sample utilized to obtain the product. However, for simplicity, a separate storage unit 30 is illustrated herein. The products stored in the storage unit 30 are then supplied to unit 35 which takes the discrete Fourier transform of the batch of products, computes the complex absolute value (power) in each of the discrete Fourier transform "bins" or synthesized filters, and, treating the batch of N resulting numbers as an N-dimensional vector, normalizes it so that it has a known length, e.g., one. The net result is to pass the signal at the terminal 10 through a filter bank of N stages having a frequency response as illustrated in FIG. 2 and to sample the output of each filter. The spectral features or samples are available at the output of the unit 35 and are supplied to a spectral classifier for comparison with previous samples, known samples, or other processing. The timing of the various components illustrated in FIG. 3 can be such that new samples are being entered into shift register 15 as the discrete Fourier transform is being taken of the previously obtained products. The constants stored in memory 20 are calculated in accordance with equations (10), (12) and (16) above, to within a scale factor.

Thus, an improved preprocessor for spectral pattern classification systems is disclosed, which preprocessor is designed to supply conditioned spectra to a spectral pattern classification system. The conditioning operation carried out by the preprocessor introduces reduced sensitivity to small changes in spectral line positions and amplitudes that would lead to significant distortions of a normal power spectrum. The preprocessor also normalizes the conditioned spectrum so as to introduce insensitivity to absolute signal power. The preprocessor can be used to increase the classification accuracy of radar, sonar, acoustic, magnetic, seismic, and speech spectrum classifiers.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. A preprocessor for spectral pattern classification systems comprising a plurality of channel bandpass filter stages, the frequency response of the k-th frequency stage being substantially defined by $$H_k^\alpha(e^{j\omega}) = \begin{cases} \cos^{\frac{1}{2}}\left(\frac{\omega N - 2\pi k}{4\alpha}\right), & (k-\alpha)\frac{2\pi}{N} \leq \omega \leq (k+\alpha)\frac{2\pi}{N} \\ 0 \text{ otherwise} \end{cases}$$

where $K = 0, \alpha, 2\alpha, 3\alpha, \ldots, [4]r\alpha$ where N is the number of samples of data being filtered, $r+1$ is the number of stages, and $\alpha$ is an appropriately chosen positive integer constant typically selected to be $=1, 2, 3,$ or $4$.

2. A preprocessor as claimed in claim 1 wherein the channel bandpass filter stages include an input adapted to have samples of the signal to be classified applied thereto, a memory having a plurality of weights, $w(n)$, stored therein each weight being substantially defined (for the $\alpha = 1$ case) by $$w(n) = \frac{1}{\pi} \int_0^{\frac{2\pi}{N}} \cos^{\frac{1}{2}}\left(\frac{\omega N}{4}\right) \cos\left[\omega\left(n - \frac{N-1}{2}\right)\right] d\omega \quad (17)$$

where $n = 0, 1, 2, \ldots, N-1$, multiplying means coupled to said input and said memory for multiplying each sample by one of said weights, and filter means for taking the discrete Fourier transform of the products.

3. A preprocessor as claimed in claim 2 further including power means coupled to the filter means for computing the power present in each discrete Fourier transform channel, and means coupled to the power means for normalizing the resulting discrete Fourier transform power vector.

4. A preprocessor as claimed in claim 3 wherein the memory and multiplying means are in digital form and the input further includes an analog to digital converter.

5. A preprocessor for spectral pattern classification systems comprising a plurality of channel bandpass filter stages, the frequency response, $H_k(e^{j\omega})$, of each stage being substantially defined (for the $\alpha = 1$ case) by $$\hat{H}_k(e^{j\omega}) =$$

$$e^{j\frac{2\pi}{N}\left(\frac{N-1}{2}\right)k} e^{-j\omega\left(\frac{N-1}{2}\right)} \sum_{n=0}^{N-1} w(n) e^{-j\frac{2\pi}{N}nk} e^{j\omega n},$$

$$k = 0, 1, \ldots, N-1$$

where
N = number of filter stages, $$w(n) = \frac{1}{\pi} \int_0^{\frac{2\pi}{N}} \cos^{\frac{1}{2}}\left(\frac{\omega N}{4}\right) \cos\left[\omega\left(n - \frac{N-1}{2}\right)\right] d\omega$$

$n = 0, 1, 2, \ldots, N-1$, and
$k = 0, 1, 2, \ldots, N-1$.

6. A method of preprocessing signals for spectral pattern classification comprising the steps of:
providing samples of the signal to be classified;
providing a plurality of filter constants, $w(n)$, generally defined (for the $\alpha = 1$ case) by the equation $$w(n) = \frac{1}{\pi} \int_0^{\frac{2\pi}{N}} \cos^{\frac{1}{2}}\left(\frac{\omega N}{4}\right) \cos\left[\omega\left(n - \frac{N-1}{2}\right)\right] d\omega$$

where:
N = numer of overlapping filters used, and
$n = 0, 1, 2, \ldots, N-1$;

multiplying each sample by one of said filter constants; and taking discrete Fourier transforms of the products.

7. A method according to claim 6 wherein the step of taking discrete Fourier transforms include the steps of computing the power present in each selected discrete Fourier transform channel and normalizing the resulting power vector.

8. A method according to claim 6 including the steps of converting the samples to digital signals.

9. A method according to claim 6 wherein the step of providing filter constants includes calculating the constants and storing a digital representation thereof.

* * * * *

UNITED STATES PATENT AND TRADEMARK OFFICE
CERTIFICATE OF CORRECTION

PATENT NO. : 4,783,754

DATED : November 8, 1988

INVENTOR(S) : Jerald L. Bauck et al.

It is certified that error appears in the above-identified patent and that said Letters Patent is hereby corrected as shown below:

In column 7, claim 1, line 69, delete "[4]" before the end of the equation which has the letters "ra".

Signed and Sealed this

Sixteenth Day of May, 1989

Attest:

DONALD J. QUIGG

*Attesting Officer*  *Commissioner of Patents and Trademarks*